United States Patent [19]
Shouen

[11] Patent Number: 6,086,625
[45] Date of Patent: *Jul. 11, 2000

[54] METHOD AND APPARATUS FOR DESIGNING A CIRCUIT BY DESCRIBING LOGIC DESIGN INFORMATION WITH A HARDWARE DESCRIPTION LANGUAGE

[75] Inventor: Akihisa Shouen, Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/509,007

[22] Filed: Jul. 31, 1995

[30] Foreign Application Priority Data

Jan. 31, 1995 [JP] Japan ..................................... 7-013666

[51] Int. Cl.$^7$ ...................................................... G06F 17/50
[52] U.S. Cl. ...................... 716/1; 716/2; 716/8; 716/11; 716/18
[58] Field of Search .................................... 364/488–491; 366/578; 395/500, 500.02, 500.03, 500.09, 500.12, 500.19

[56] References Cited

U.S. PATENT DOCUMENTS

| | | | |
|---|---|---|---|
| 5,224,056 | 6/1993 | Chen et al. ......................... | 395/500.08 |
| 5,239,465 | 8/1993 | Hatfori et al. ...................... | 395/500.09 |
| 5,416,721 | 5/1995 | Nishiyama et al. ................ | 395/500.12 |
| 5,426,591 | 6/1995 | Ginetti et al. ....................... | 395/500.07 |
| 5,513,124 | 4/1996 | Trimberger et al. ............... | 395/500.08 |
| 5,530,654 | 6/1996 | Takahashi ........................... | 395/500.19 |

OTHER PUBLICATIONS

Kedem et al "Asic Design With Oasis," IEEE, pp. 2580–2583, 1990.

Hu et al "A Methodology For Design Verification," IEEE, pp. 236–239, Sep. 1994.

*Primary Examiner*—Paul R. Lintz
*Assistant Examiner*—Vuthe Siek
*Attorney, Agent, or Firm*—Staas & Halsey LLP

[57] ABSTRACT

A circuit design method and a circuit design apparatus of this invention allow a judgement from a broader view based on high-level design information inputted upon a logic design to determine a rough packaging design. A rough placement position of a function block cell, which can configure a circuit that is an object of the design, unit on a circuit is determined on the basis of abstract circuit information in an abstract level higher than that of packaging design basic cell obtained in a logic design. On the basis of the rough placement position and the abstract circuit information, the function block cell is two-dimensionally developed into the packaging design basic cell, and a packaging design of the circuit that is an object of the design is performed. The method and apparatus of this invention is applicable to a design of a circuit such as an LSI, a PWB, etc.

24 Claims, 11 Drawing Sheets

```
entity VHDL is
   port A,B,C :    in bit vector(0 to 7)
   port Z     :    out bit vector(0 to 7) );
end ;
architecture VHDL I of VHDL is
begin
 Z<= (A and B) or C;
end VHDL I;
```

```
entity VHDL.LSI is
  port (A,B,C
    :
end ;
architecture RBK1 of..
-- rough location A1/B2 500-400
begin
    :
end ;
architecture RBK2 of..
-- rough location A4/B4 500-400
begin
    :
end ;
architecture RBK3 of..

begin
    :
end ;
```

```
-- rough location A2 1000-800
entity BLK9 is
    port(AI,BI,CI,DI, ... HI,JI)
        :
end ;
-- rough port AI,BI = LD          ← AN EXAMPLE WHERE
-- rough port HI,JI = UL            A TERMINAL DRAWING
        :                           DIRECTION IS SPECIFIED
-- rough length AI,BI = 3000      ← AN EXAMPLE WHERE WIRE
-- rough length HI,JI = 4000        LENGTH LIMITATION IS
architecture  RBK9 of ..            SPECIFIED
begin
    :
end ;
```

F I G. 9
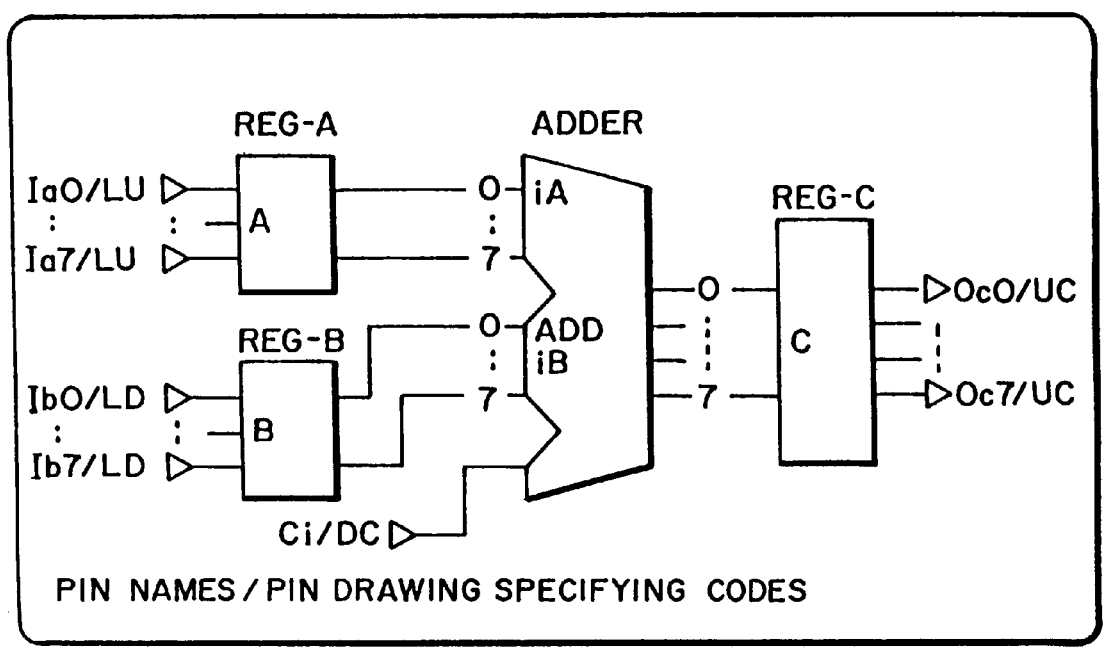

METHOD AND APPARATUS FOR DESIGNING A CIRCUIT BY DESCRIBING LOGIC DESIGN INFORMATION WITH A HARDWARE DESCRIPTION LANGUAGE

BACKGROUND OF THE INVENTION

1) Field of the Invention

The present invention relates to a circuit design method and a circuit design apparatus used to design a circuit or the like on a large scale integrated circuit (LSI) or a printed wiring board (PWB).

In recent years, there has been a demand for high-speed, advanced functions and high-density in an information processing apparatus. At the same time, there has been a need to reduce a term for designing such information processing apparatus. In consequence, a design allowing a higher performance of an electronic equipment (an electric circuit) such as an LSI, PWB, etc. is expected to develop.

2) Description of the Related Art

When a packaging design for a circuit such as an LSI is carried out, information of all logic circuits about the circuit is developed into packaging design basic cells (hereinafter, abbreviated as BC occasionally), the package design (a placement design of the BCs and a routing design between the BCs) is then carried out based on a result of the development and connection information between the BCs.

The information of the logical circuit about the circuit that is an object of the design may be obtained by logically synthesizing information (Boolean expressions before the logical synthesis) inputted in a text mode (a list of character strings) using a hardware description language (hereinafter, abbreviated as HDL, occasionally) to develop it into function symbols.

The information of the logical circuit may be directly inputted as function symbols in a text mode, or directly inputted as function symbols in an interactive mode by referring to a display or the like.

Recently, circuits such as a LSI have become highly integrated. If design information of one circuit is described in a level of elements or gates, a volume of the information becomes enormous. For this, the design information is described with a logical circuit to be abstracted so that the design information may be described in a less volume of information. The packaging design is then performed on the basis of the information of the logical circuit.

The HDL or function symbol information used to input the logical circuit information is collectively termed as a high-level language from a viewpoint that they are information (language) in an abstract level (a functional description level) higher than that of an element or a gate.

Now, the HDL will be described in brief.

As a method for describing an electronic system or a logical circuit, a schematic capture has been used for a long time. The schematic capture is visible. The schematic capture therefore has an advantage that the designer can understand intuitively a configuration of the circuit. However, the schematic capture does not directly include information of a function, an operation, a timing of the operation, a delay time, etc. of the circuit so that it is impossible to fully describe the design information. If the schematic capture is processed in a computer, a high-speed process of the schematic capture is difficult since it is necessary to express the schematic capture as a graph including positional information. If a circuit such as an LSI in a larger scale is designed, the number of sheets of the schematic capture becomes too many for the designer to grasp it.

To solve the above problem, a method in a text (a language) has been developed as a method excepting the schematic capture for describing the design information of an electronic system or a logical circuit. The language used to describe an electronic system or a logical circuit is termed as a hardware description language (HDL) in a sense discriminating it from a software programming language. The HDL allows a description of a function or a configuration of an electronic system or a logical circuit. In order to design a large scale circuit such as an LSI, it is effective to enhance the design level from the logical gate level to the micro architecture level and perform a hierarchical design.

Compared with a description with the schematic capture above described, the HDL has, in general, the following features:

(1) the HDL is suitable for inputs and outputs, and processes of the computer since it is described with a list of character strings (a text mode);

(2) the HDL can be used as a part of a use description of a circuit that is an object of the design;

(3) the HDL can directly describe detailed timing information of an object of the design;

(4) the HDL provides data of less volume since there is no need to describe geometrical information of the circuit; and (5) the HDL is suitable for automatic design since it allows easy logical synthesis or verification of a hardware.

FIG. 14 shows an example of a typical apparatus performing a package design for a circuit such as an LSI using a high-level language including the above HDL.

In FIG. 14, reference numeral 1 denotes an HLD input unit for inputting logic design information (Boolean expression information before the logical synthesis) in a text mode using the HDL. As this HLD, a VHDL [VHSIC (Very High Speed IC) Hardware Description Language] that is a standard HDL of IEEE is used, for example.

Reference numeral 2 denotes a file for storing text information (logic design information) inputted from the HDL input unit 1. Reference numeral 3 denotes logical synthesis processing unit. The logical synthesis processing unit 3 reads the text information stored in the file 2, performs a logic synthesis process on the text information to develop the text information into function symbols.

Reference numeral 4 denotes an interactive input unit for inputting high-level function symbols such as AND, OR, ADDER, etc. or connection information between these symbols as logic circuit information (intermediate information before developed into BCs) in an interactive mode. The interactive input unit 4 is configured with, for example, a terminal apparatus having a display for displaying function symbols thereon, and an input unit such as a keyboard, a mouse or the like operated by a designer to input an instruction by referring to a display on the display. Similarly, reference numeral 5 denotes a text input unit for inputting the high-level function symbols such as AND, OR, ADDER, etc. or connection information between them as logic circuit information in an interactive mode.

Reference numeral 6 denotes a file (a database) for storing a result of the process by the logic synthesis processing unit 3 and the logic circuit information from the interactive input unit 4 and the text input unit 5 as logic input information (design information in a high-level language).

Reference numeral 7 denotes a BC mapping process unit. The BC mapping process unit 7 reads out the logic input information in the functional description level stored in the file 6, develops the logic input information into BCs in a specified semiconductor process, and maps the BCs one-dimensionally in consideration of logical connectional relations. The BC mapping process unit 7 has a function (a reduction function) to delete superfluous BCs that are functionally mapped such as gates in addition to the above mapping process function.

Reference numeral 8 denotes a file for storing a result of the process by the BC mapping process unit 7. In the file 8, the logic information is stored in a state where the all logic information is developed in the BC level.

Reference numeral 9 denotes a packaging design unit for performing a package design on the basis of the information stored in the file 8. The packaging design unit 9 has a grouping process unit 10, a floor planner 11, a BC placement processing unit 12 and a BC routing process unit 13.

The grouping process unit 10 groups the developing information for the BCs stored in the file 8 depending on a page unit or a function unit, etc. The floor planner 11 performs a rough design of blocks grouped by the grouping process unit 10 in an interactive mode. The floor planner 11 is configured with a terminal apparatus having a display for displaying a condition of the rough design, etc., and an input unit such as a keyboard, a mouse, etc. operated by the designer to input an instruction by referring to a display on the display, similarly to the interactive input unit having been described above.

The BC placement processing unit 12 develops a content of each block placed in a group by the floor planner 11, initially places the BCs constituting each block on actual coordinates and performs a refining process so that the placement condition of the BCs is optimal. The BC routing process unit 13 performs a routing between the BCs placed on the predetermined coordinates by the BC placement processing unit 12 under specified conditions (a condition of wire length limitation, etc.)

Reference numeral 14 denotes a mask design data generating unit. The mask design data generating unit 14 generates design data for a mask necessary to fabricate a semiconductor (an LSI, etc.) on the basis of a result of the packaging design by the packaging design unit 9.

When a package design for a circuit such as an LSI is performed with the above structure, the logic circuit information of the circuit that is an object of the design is inputted from the HDL input unit 1 in a text mode such as the VHDL or the like and from the interactive input unit 4 or the text input unit 5 as high-level function symbols or the connection information between the symbols.

The text information from the HDL input unit 1 is once stored in the file 2, then developed into function symbols by the logic synthesis processing unit 3, and stored in the file 6 together with the information from the interactive input unit 4 or the text input unit 5.

After that, the BC mapping process unit 7 reads out the logical input information in the functional description level stored in the file 6. The logic input information is developed into BCs in a specified semiconductor process. These BCs are mapped in one-dimensionally in consideration of the logical connectional relations, and a result of the mapping process is stored in the file 8.

In the packaging design unit 9, the grouping process unit 10 first groups the developing information for the BCs stored in the file 8 depending on a page unit or a function unit, and the floor planner 11 then performs a rough design of the grouped blocks in an interactive mode.

When the rough design by the floor planner 11 is completed, the BC placement processing unit 12 develops a content of each block placed in a group by the BC placement processing unit 12. The BCs constituting each block is initially placed on the actual coordinates. A refining process to refine a condition of the placement of the BCs is performed so that the condition of the placement is optimal.

Further, the BC routing process unit 13 performs a routing between the placed BCs on the basis of the connection information under specified conditions.

By repeating the above processes in the packaging design unit 9, the BCs are most suitably placed and the BCs most suitably placed are routed.

On the basis of a result of the package design obtained as above, the mask design data generating unit 14 generates design data for a mask necessary to fabricate a circuit such as a semiconductor. The design data is sent to a factory in which the circuit is actually fabricated.

In the above-described circuit design means known in the art, the packaging design is started on the basis of information obtained by developing all logic circuit information about a circuit that is an object of the design into BCs and the connection information between the BCs. This causes an enormous volume of information treated by the packaging design unit 9. For example, a volume of the information stored in the file 4 is approximately 10 times that of the information stored in the file 2. Further, a volume of the information stored in the file 8 reaches approximately 100 times that of the above-mentioned initial information.

For this, a material necessary for a storage or the like constituting the file 8 or a period necessary for the CPU process (that is, a processing time of the packaging design unit 9) becomes enormous, the material and the processing time are thus wasteful. In consequence, a problem is that the more complicated the circuit that is an object of the design, the more difficult the packaging design processing is.

SUMMARY OF THE INVENTION

In the light of the above problem, an object of this invention is to provide a circuit design method and a circuit design apparatus to allow a judgement from a broader view based on high-level design information inputted upon a logic design to perform a rough packaging design, thereby increasing an efficiency in the packaging design process and enabling a development of a high-performance product.

According to this invention, a method for designing a circuit comprising the steps of determining a rough placement position of a function block cell configuring a circuit that is an object of a design on said circuit on the basis of abstract circuit information in an abstract level higher than that of a packaging design basic cell obtained in a logic design, and developing two-dimensionally said function block cell into said package design basic cells on the basis of said rough placement position and said abstract circuit information to perform a packaging design of said circuit that is an object of the design.

According to this invention, an apparatus for designing a circuit comprising a logic design unit for performing a logic design of a circuit that is an object of a design, a rough design unit for determining a rough placement position of a function block cell that can configure said circuit that is an object of the design on said circuit on the basis of abstract circuit information in an abstract level higher than that of a packaging design basic cell obtained by said logic design unit, and a packaging design unit for two-dimensionally developing said function block cell into said packaging design basic cells on the basis of said abstract circuit information and said rough placement position determined by said rough design unit to perform a packaging design of said circuit that is an object of the design.

According to this invention, the circuit design method and the circuit design apparatus of this invention allow a judgement on a packaging design image from a broader view based on the abstract circuit information inputted upon the logical design, thereby largely improving an efficiency in the packaging design process and realizing a development of a high-performance product. Accordingly, it is possible to increase a yielding rate and reduce a cost when the circuit is fabricated. The method and apparatus of this invention are very useful when an electronic circuit such as an LSI whose scale will increase more and more in the future is designed and fabricated.

BRIEF DESCRIPTION OF THE DRAWINGS

FIG. 9 shows an example of an description of a logic circuit with function symbols;

DESCRIPTION OF THE PREFERRED EMBODIMENT (a) Description of an Aspect of the Invention In FIG. 1, reference numeral 21 denotes a logic design unit for performing a logic design for a circuit that is an object of the design, 22 denotes a rough design unit, and 23 denotes a packaging design unit.

Figure 1:
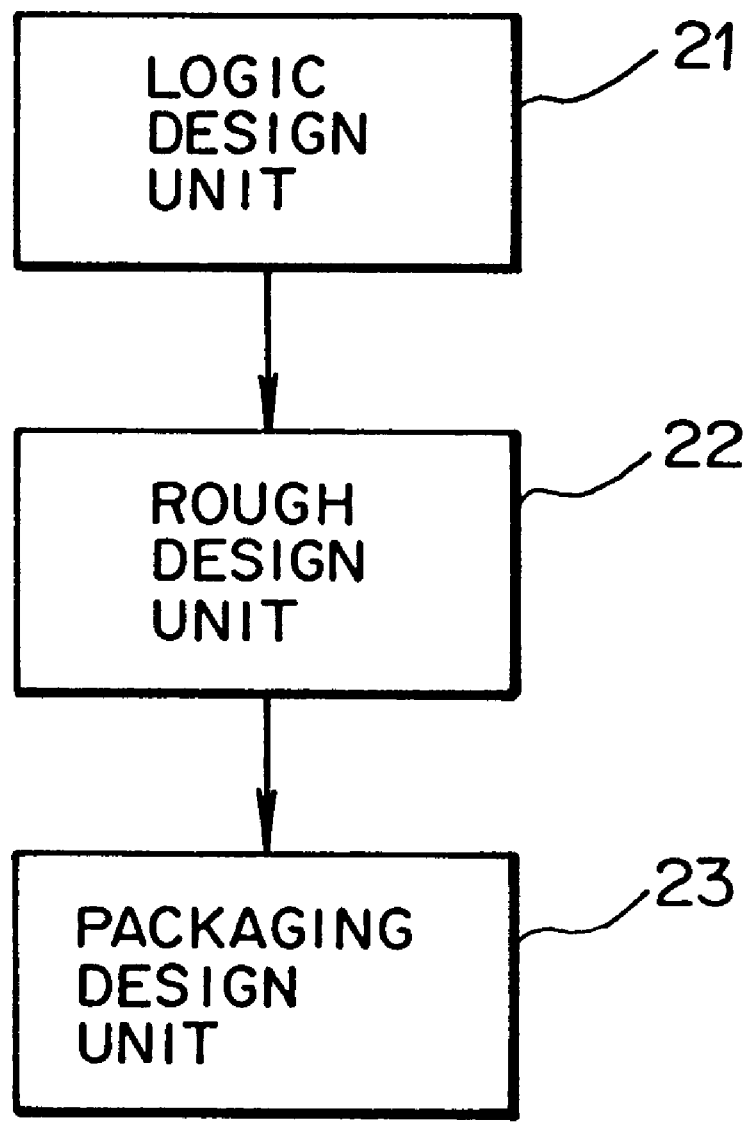
FIG. 1 is a block diagram showing an aspect of this invention.

The rough design unit 22 determines a rough placement position of a function block cell that can configure the circuit that is an object of the design on the circuit on the basis of abstract circuit information in an abstract level higher than that of a packaging design basic cell obtained by the logic design unit 21.

The packaging design unit 23 two-dimensionally develops the function block cell into a packaging design basic cell on the basis of the abstract circuit information and the rough placement position determined by the rough design unit 22 and performs a packaging design of the circuit that is an object of the design.

The rough placement positions of the function block cell may be given in advance as the rough placement information to the abstract circuit information, and the rough design unit 22 may determine a rough placement position on the basis of the rough placement information.

Terminal positions of the circuit that is an object of the design which should be connected to the function block cell may be given in advance as the rough placement information to the abstract circuit information, and the rough design unit 22 may determine the rough placement position on the basis of the terminal positions.

Further, the terminal positions of the function block cell and connection information to anther function block cell may be given in advance as the rough placement information to the abstract circuit information, and the rough design unit 22 may determine the rough placement position on the basis of the terminal positions and the connection information. At that time, the rough design unit 22 may hierarchize plural function block cells close to each other as one function block cell on the basis of the terminal positions and the connection information, and determine a rough placement position of the hierarchized function block cell.

A placement region of packaging design basic cells when the function block cell is developed into the packaging design basic cells may be given to the abstract circuit information, and the packaging design unit 23 may perform the packaging design while reflecting the placement region.

Wire length limitation information between the function block cells may be given in advance to the abstract circuit information, and the packaging design unit 23 may perform the packaging design while reflecting the wire length limitation information.

It is possible to further provide an output unit for outputting a result of determination of the rough placement position as a functional scheme.

On the other hand, the logic design unit 21 may have a hardware description language input unit for inputting a hardware description language in a text mode, and a logic synthesis processing unit for synthesizing. logic circuit information from the hardware description language inputting from the hardware description language input unit and outputting it as the abstract circuit information to the rough design unit 22.

The logic design unit 21 may have a function symbol input unit for inputting function symbols that are logic circuit information as the abstract circuit information.

In the circuit design method and circuit design apparatus of this invention having been described with reference to FIG. 1, the rough design unit 22 determines a rough placement position of the function block cell on the basis of the abstract circuit information (high-level design information; Boolean expressions before the logic synthesis or intermediate information before developed into the packaging design basic cells) to perform a rough design (a virtual packaging design). It is thus possible to judge a packaging design image from a broader view.

The rough placement position may be determined by the rough design unit 22 on the basis of the rough placement information given in advance to the abstract circuit information or the terminal positions of the circuit that is an object of the design which should be connected to the function block cell.

The rough placement position may be determined by the rough design unit 22 on the basis of the terminal positions of the function block cell and the connection information to another function block cell given in advance to the abstract circuit information. At that time, it is possible to hierarchize plural function block cells close to each other as one function block cell on the basis of the terminal positions and the connection information to virtually treat the function block as a multiplex hierarchy, whereby the rough design unit 22 may determine the rough placement position more readily.

By giving the placement region of the package design basic cells to the abstract circuit information, it is possible to add and reflect the placement region upon the packaging design by the packaging design unit 23. By giving the wire length limitation information to the abstract circuit information, it is possible to add and reflect the wire length limitation information upon the packaging design by the packaging design unit 23.

The output unit outputs a result of determination of the rough placement position so that the designer can grasp a packaging design image.

Meanwhile, the abstract circuit information may be inputted as a hardware description language, and may be obtained as the logic circuit information by synthesizing the hardware description language. Otherwise, the abstract circuit information may be directly inputted as function symbols.

As stated above, according to the circuit design method and the circuit design apparatus of this invention, the packaging design image is determined from a broader view on the basis of the abstract circuit information inputted upon the logic design so that an efficiency of the packaging design process may be largely improved and a development of a high-performance product may be realized. Accordingly, it is also possible to increase a yielding rate and reduce a cost when the circuit is fabricated. In consequence, the method and apparatus of this invention are quite effective when an electronic circuit such as an LSI whose scale will be increased more and more in the future is designed and fabricated.

(b) Description of Embodiment

Hereinafter, description will be made of an embodiment of this invention referring to the drawings.

Figure 2:
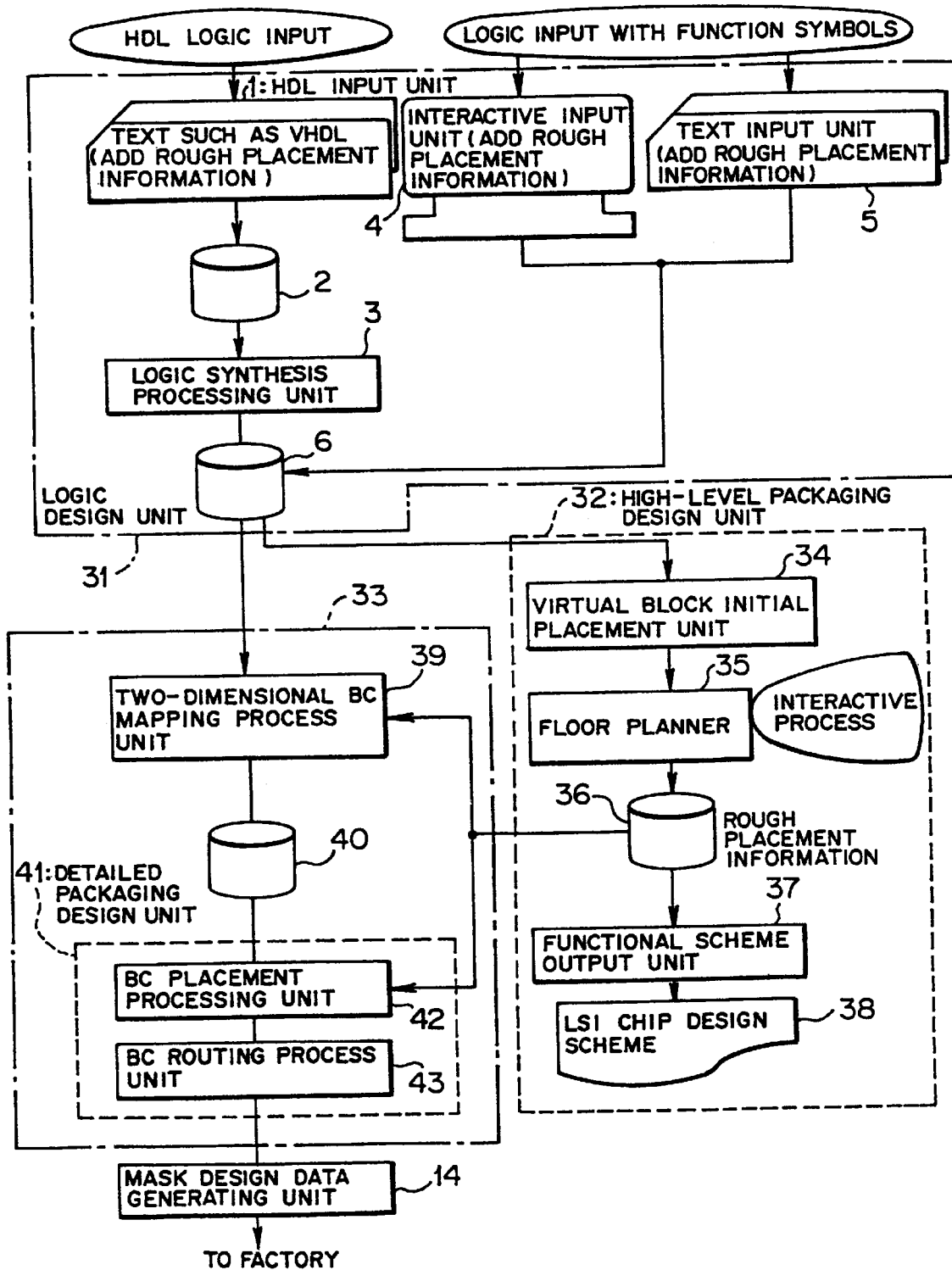
FIG. 2 is a block diagram showing a structure of a circuit design apparatus as an embodiment of this invention.

FIG. 2 is a block diagram showing a structure of a circuit design apparatus as an embodiment of this invention. In FIG. 2, reference numeral 31 denotes a logic design unit, 32 denotes a high-level packaging design unit (a rough design unit) and 33 denotes a packaging design unit.

The logic design unit 31 performs a logic design for a circuit that is an object of the design such as an LSI. The logic design unit 31 has an HDL input unit 1, a file 2, a logic synthesis processing unit 3, an interactive input unit (a function symbol input unit) 4, a text input unit (a function symbol input unit) 5 and a file 6, similarly to the logic design unit having been described with reference to FIG. 14.

The HDL input unit 1 is used to input logic design information (Boolean expression information before the logic synthesis) in a text mode using an HDL (a hardware description language) such as VHDL or the like. The file 2 stores text information (the logic design information) inputted from the HDL input unit 1. The logic synthesis processing unit 3 reads out the text information stored in the file 2, performs a logic synthesis process on the text information, and develops the text information into function symbols (abstract circuit information).

The interactive input unit 4 is used to input high-level function symbols such as AND, OR, ADDER, etc. or connection information of connections between these symbols as logical circuit information (intermediate information before developed into BCs) in an interactive mode. The text input unit 5 is used to input the high-level function symbols such as AND, OR, ADDER, etc. or the connection information of connections between these symbols as the logical circuit information in a text mode. The file 6 stores a result of the process by the logic synthesis processing unit 3 and the logical circuit information from the interactive input unit 4 and the text input unit 5 as logic input information in a functional description level (design information in a high-level language).

Figure 11:
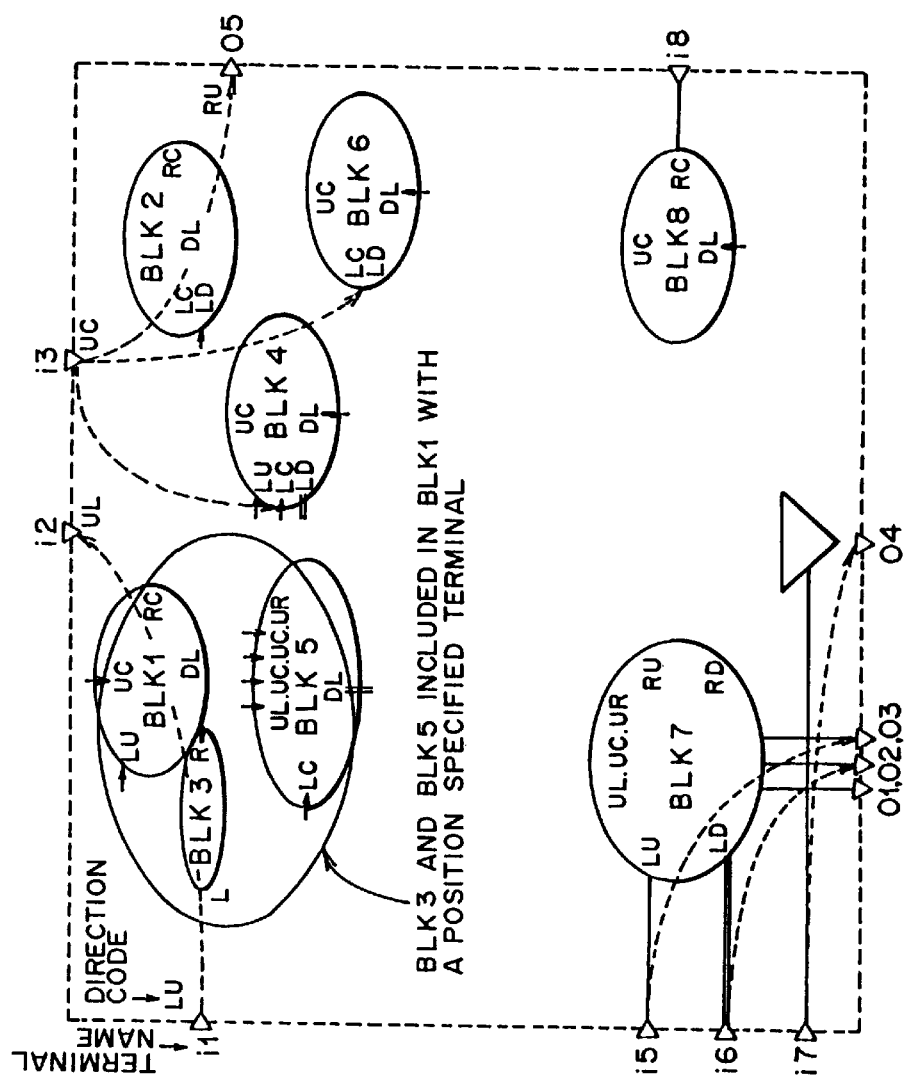
FIG. 11 shows a condition of virtual duplex hierarchical blocks roughly placed by a high-level packaging design unit.

According to this embodiment, the abstract circuit information inputted from each of the input units 1, 4 and 5 is given in advance as various rough placement information, described in (1) through (5) below:

(1) a roughly placed position of a function block cell (described later with reference to FIGS. 5 through 7);

(2) positions of terminals of a circuit that is an object of the design which should be connected to function block cell (position specified input-output terminal information; described later with reference to FIGS. 11 and 12);

(3) positions of terminals of the function block cell (rough pin information, terminal drawing direction specifying information; described later with reference to FIGS. 7 through 10), and connection information to another function block cell (a degree of logical combination; described later with reference to FIGS. 11 and 12);

(4) a region in which BCs are placed when the function block cell is developed into BCs (packaging design basic units) (described later with reference to FIGS. 5 through 7); and (5) wire length limitation information between the function block cells (described later with reference to FIG. 7).

The high-level packaging design unit 32 of this embodiment determines a rough placement position of the function block cell on the circuit, which can configure the circuit that is an object of the design, on the basis of the abstract circuit information in an abstract level higher than the BCs. The high-level packaging design unit 32 has a virtual block initial placement unit 34, a floor planner 35, a file 36 and a functional scheme output unit 37.

The virtual block initial placement unit 34 performs a virtual rough design on the basis of the information before the functional description (the rough placement information given to the abstract circuit information above-mentioned) to initially place the virtual block (a function block cell) roughly. The virtual block initial placement unit 34 has a function to multiplex and hierarchize plural virtual blocks (function block cells) close to each other on the basis of the terminal positions and the connection information from the rough placement information, to initially place the multiplexed virtual block roughly.

The floor planner 35 performs a placement refining process on a result of the virtual rough design performed by the virtual block initial placement unit 34 in an operation by the designer in an interactive mode to allow an optimum rough placement condition. The floor planner 35 is configured with a terminal apparatus having a display for displaying the rough placement condition, etc., and an input unit such as a keyboard, a mouse, etc. operated by the designer to input an instruction by referring to a display on the display.

The file 36 stores a rough placement image of the virtual block produced by the floor planner 35. The functional scheme output unit 36 makes an optimum scheme of the rough placement image (a result of the determination of the rough placement position) of the virtual block stored in the file 36 depending on a scale of the LSI, and outputs it as an LSI chip design scheme (an LSI functional placement scheme, a functional scheme).

The packaging design unit 33 of this embodiment two-dimensionally develops the function block cell (a virtual block) into BCs on the basis of the abstract circuit information stored in the file 6 and the rough placement position determined by the rough design unit 32 to perform a packaging design of the circuit that is an object of the design. The packaging design unit 33 has a two-dimensional BC mapping process unit 39, a file (a database) 40 and a detailed packaging design unit 41.

The two-dimensional BC mapping process unit 39 develops each function block cell (a virtual block) into BCs in a specified semiconductor process on the basis of the abstract circuit information (the logic input information in the functional description level) stored in the file 6 and the rough placement information (roughly placed position, rough pin information, etc.) determined by the rough design unit 32 to map the BCs two-dimensionally. The two-dimensional BC mapping processing unit 39 has a function (a reduction function) to delete, for example, unnecessary gates which are functionally mapped duplicatedly in addition to the above mapping process function.

The file 40 stores a result of the process by the two-dimensional BC mapping processing unit 39. In the file 40, the logic information (the logic input information in the functional description level) is stored in a state where the logic information is all developed in the BC level.

The detailed packaging design unit 41 performs a detailed packaging design of the circuit that is an object of the design. The detailed packaging design unit 41 has a BC placement processing unit 42 and a BC routing process unit 43.

The BC placement processing unit 42 initially places the developed BCs in each block stored in the file 40 on actual coordinates according to the rough placement information stored in the file 36, then so refines the placement condition of the BCs that the placement condition of the BCs is optimal. If a placement region that should assure a routing delay [refer to (4) described above] is specified at that time, the process is so performed that the corresponding BCs are placed within the specified region.

The BC routing process unit 43 automatically routes the BCs placed on predetermined coordinates by the BC placement processing unit 42 under specified routing conditions [the wire length limitation information in (5) described above].

Figure 14:
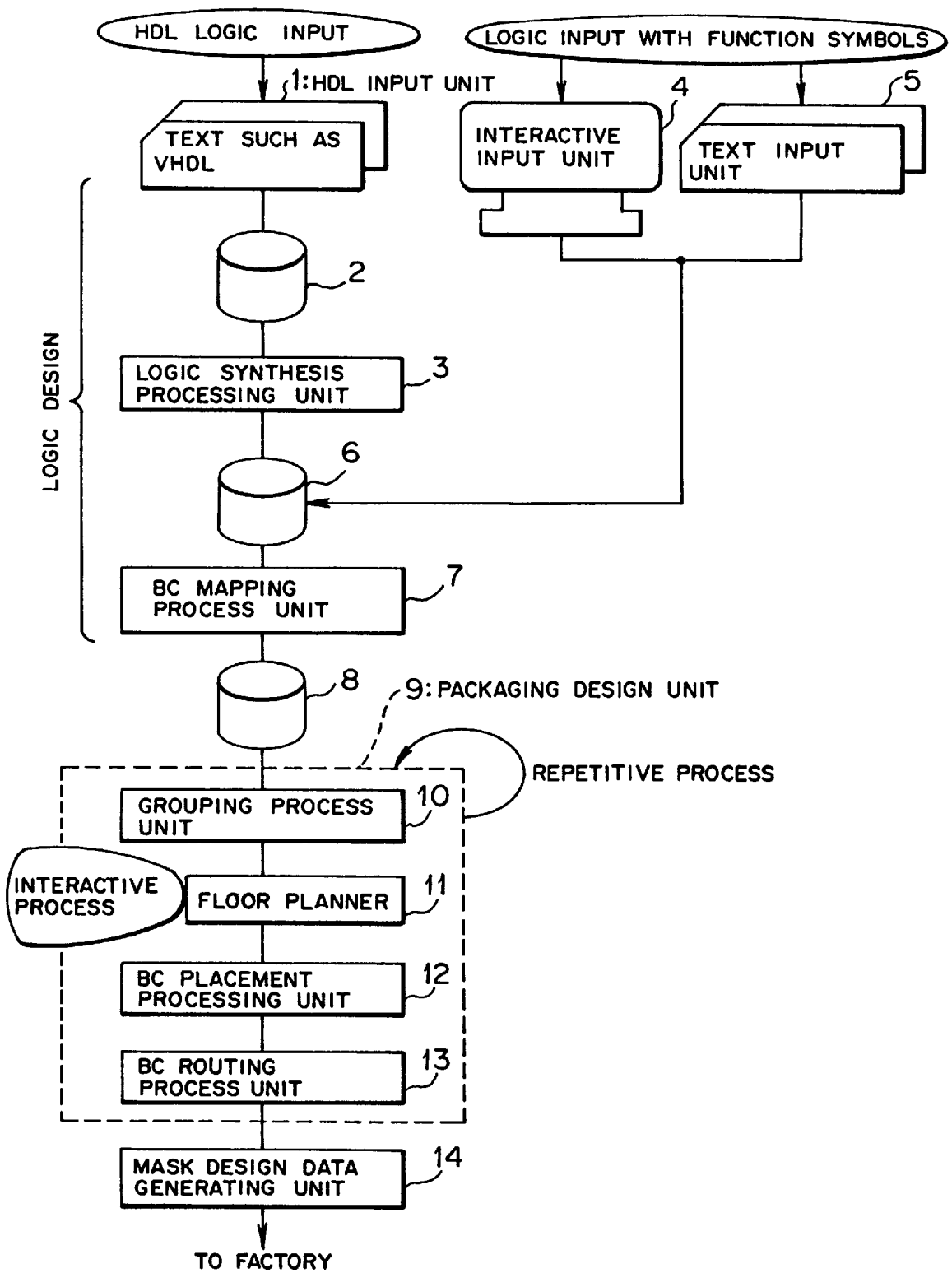
FIG. 14 is a block diagram showing a structure of a typical circuit design apparatus.

The mask design data generating unit 14 generates design data of a mask necessary to fabricate a semiconductor on the basis of a result of the packaging design by the packaging design unit 33, similarly to that shown in FIG. 14.

Next, an operation of the circuit design apparatus of this embodiment having the above structure will be next described.

Figures 3, 4:
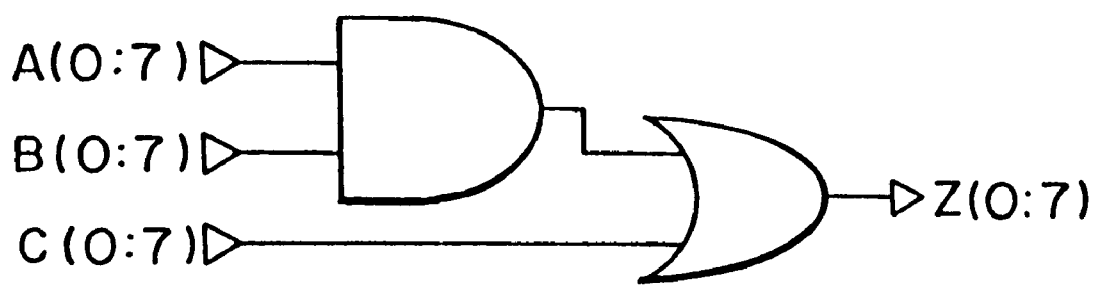
FIG. 3 shows an example of a basic description in a VHDL syntax.
FIG. 4 shows a result of logic synthesizing process on the VHDL syntax shown in FIG. 3.

From the HDL input 1, high-level logic design information described in an HDL such as VHDL, Verilog HDL, UDL/I, SFL, etc. is inputted in a text mode. FIG. 3 shows an example of a basic description in the VHDL syntax. Detailed description of this example will be made later.

If a rough position or a placement region is desired to be specified particularly, information defining it is added at the same time. This information becomes the rough placement information when the virtual block is placed by the virtual block initial placement unit 34. It is possible to give rough intput-output terminal position information or the wire length limitation information between the blocks at the same time to specify them. FIGS. 5 and 7 show examples of the descriptions in the VHDL syntax given the rough placement information such as the rough position or the like. Detailed description of these examples will be made later.

The logic synthesis processing unit 3 reads out the information stored in the file 2, performs a logic synthesis according to the description grammar, develops the information into logical data in the function symbol level and stores it in the file 6. A volume of the information obtained in the logic synthesis process results in approximately 10 times as much as that of the information stored in the file 2.

For instance, by performing a process on a VHDL syntax as shown in FIG. 3 by the logic synthesis processing unit 3, a result of the logic synthesis as shown in FIG. 4 is obtained. In the example shown in FIGS. 3 and 4, a circuit has three ports each of 8 bits as input terminals (designated by reference characters A, B and C), one port of 8 bits as an output terminal (designated by a reference character Z), in which a result of AND of data from a port A and a port B, and an OR of data from a port C are outputted from a port Z.

If the rough placement information is given to simple function symbols such as AND, OR, etc. or a large-scaled, complicated function symbols (refer to FIG. 9, for example) such as FULL-ADDER, etc., the rough placement information is designated and inputted in an interactive mode by the interactive input unit 4 or in a text mode by the text input unit 5 simultaneously with an input of the function symbols. The function symbols (the logic design information) given the rough placement information as above are stored in the file 6.

The logic design information synthesized by the logic synthesis processing unit 3 is also stored in the file 6. Accordingly, there is stored substantially complete information of one logic function as a whole of the logic design information. The logic information in the file 6 includes all input-output pins (input-output terminals) or basic signal information. This means that the most suitable volume of information and contents for performing the floor planning process such as the rough placement or the like useful to grasp the entire circuit that is an object of the design from a broader view are stored in the file 6.

Figures 5, 6:
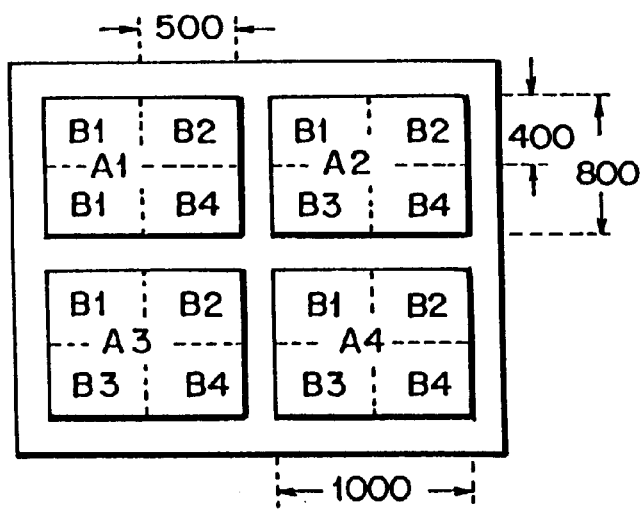
FIG. 5 shows an example of a description in the VHDL syntax to which rough placement positions and rough placement regions as rough placement information are given.
FIG. 6 illustrates rough placement positions.

FIG. 5 shows an example where the rough placement position and the rough placement region are described in advance in the VHDL on the text as the rough placement information and given. The example shown in FIG. 5, the logical circuit information of virtual blocks (function block cells) RBK1, RBK2 and RBK3 are described in the VHDL, and information about the rough placement positions and the rough placement regions (rough locations) are also described as information about the respective virtual blocks RBK1, RBK2 and RBK3.

The information about the rough placement positions and the rough placement regions, that is, the rough location information are practically set, for example, as shown in FIG. 6. In the example shown in FIG. 8, the placement region of BCs on the LSI that is an object of the design is roughly divided into four regions A1 through A4. Each of the regions A1 through A4 is further divided into four regions B1 through B4. Incidentally, each of the regions A1 through A4 is a rectangle of, for example, 1000 μm×800 μm, and each of the regions B1 through 4B is a rectangle of, for example, 500 μm×400 μm.

In the text shown in FIG. 5, the rough placement position and the rough placement region of the virtual block RBK1 are described as "A1/B2 500–400". This signifies that the virtual block RBK1 should be roughly placed within the small region B2 (a region of 500 μm×400 μm) within the region A1 shown in FIG. 6. Similarly, the rough placement position and the rough placement region of the virtual block RBK2 is described as "A4/B4 500–400". This signifies that the virtual block RBK2 should be roughly placed within the small region B4 (a region of 500 μm×400 μm) in the region A4 shown in FIG. 6.

In the example of the VHDL description shown in FIG. 5, the rough location information of the virtual blocks RBK1 and RBK2 is information not directly relating to the logical function, but used as preferential rough placement information when the virtual blocks are placed by the virtual block initial placement unit 34. On the basis of this rough location information, the virtual block is roughly placed in any region having been described with reference to FIG. 6.

No rough location information about the virtual block RBK3 is described in FIG. 5. It is, however, possible to separately specify the rough location information upon a process in an interactive mode by the floor planner 35. The rough location information may be given likewise when the logic is inputted with function symbols from the interactive input unit 4 or the text input unit 5.

Figures 7, 8:
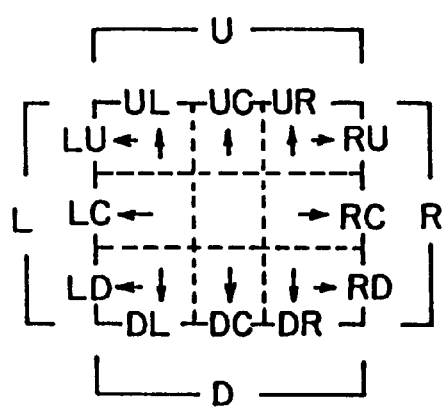
FIG. 7 shows an example of an description in the VHDL syntax to which a rough placement position, a rough placement region, terminal drawing direction specifying information and wire length limitation information are given as the rough placement information.
FIG. 8 illustrates the terminal drawing direction specifying information (terminal position information)

FIG. 7 shows an example where a rough placement position, a rough placement region, terminal drawing direction specifying information (rough terminal position information) and wire length limitation information are given in advance as the rough placement information in the VHDL in the text. In the example shown in FIG. 7, logic circuit information of the virtual block (a function block cell) BLK9 is described in the VHDL, where terminal drawing direction specifying information (rough port) and wire length limitation information (rough length) are described as information about the virtual block BLK9 along with information (rough location) of the rough placement position and the rough placement region.

The rough location information is as having been described with reference to FIGS. 5 and 6. In the example shown in FIG. 7, the rough placement position and the rough placement region of the virtual block BLK 9 are described as "A2 1000–800". This signifies that the virtual block BLK9 should be roughly placed within the region A2 (a region of 1000 μm×800 μm) shown in FIG. 6.

The text shown in FIG. 7 says that the virtual block BLK 9 has terminals (ports or pins) specified by reference characters AI, BI, CI, DI, . . . HI and JI. The text also says rough port information and rough length information about each of the terminals.

As the terminal drawing direction specifying information (the rough terminal position information), that is, the rough port information, codes set as shown in FIG. 8 are used, for example. An example shown in FIG. 8, each side of a rectangle corresponding to a virtual block is divided into three portions, and which portion each of the terminal is placed in is specified and described as the rough port information.

More specifically, codes specifying an upper portion, a middle portion and a lower portion on the left side are "LU", "LC" and "LD", respectively, codes specifying an upper portion, a middle portion and a lower portion on the right side are "RU", "RC" and "RD", respectively, and codes specifying a left portion, a middle portion and a right portion on the top side are "ULt", "UC" and "UR", respectively, and codes specifying a left portion, a middle portion and a right portion on the bottom side are "DL", "DC" and "DR", respectively. If a terminal is placed in each of the portions, a direction in which the terminal is drawn out is indicated by an arrow in the block in FIG. 8.

Accordingly, the text shown in FIG. 7 says as the rough port information that the ports AI and BI are drawn out from a portion of the code LD (that is, the lower portion on the left side), and the ports HI and JI are drawn out from a portion of the code UL (that is, the left portion on the top side).

Further, the text shown in FIG. 7 says wire length limitation information, that is, rough length information, such that a total wire length of a wire passing through the ports AI and BI is 3000 μm or less and a total wire length of a wire passing through the ports HI and JI is 4000 μm or less.

The rough port information or the rough length information described above may be separately specified upon a process in an interactive mode by the floor planner 35 as well as the rough location information, or specified upon a logic input with function symbols through the interactive input unit 4 or the text input unit 5. FIG. 9 shows an example where the rough port information is specified in an interactive mode by the interactive input unit 4 or the floor planner 35.

FIG. 9 shows the example where a logic circuit configuring one virtual block (a function block cell) is described with function symbols. A logic circuit shown in FIG. 9 has two registers REG-A and REG-B in each of which data of 8 bits is stored, an adder ADDER for adding the two sorts of data stored in these registers and a register REG-C for storing data of 8 bits which is a result of the addition by the adder.

A code LU (specifying the upper portion on the left side as a terminal position) is given as the rough port information to input terminals Ia0 through Ia7 connected to the register REG-A, and a code LD (specifying the lower portion on the left side as a terminal position) is given as the rough port information to input terminals Ib0 through Ib7 connected to the register REG-B.

A code DC (specifying the middle portion on the bottom side as a terminal position) is given as the rough port information to a terminal Ci connected to the adder ADDER, and a code UC (specifying the middle portion on the top side as a terminal position) is given as the rough port information to output terminals Oc0 through Oc7 connected to the register REG-C.

Figure 10:
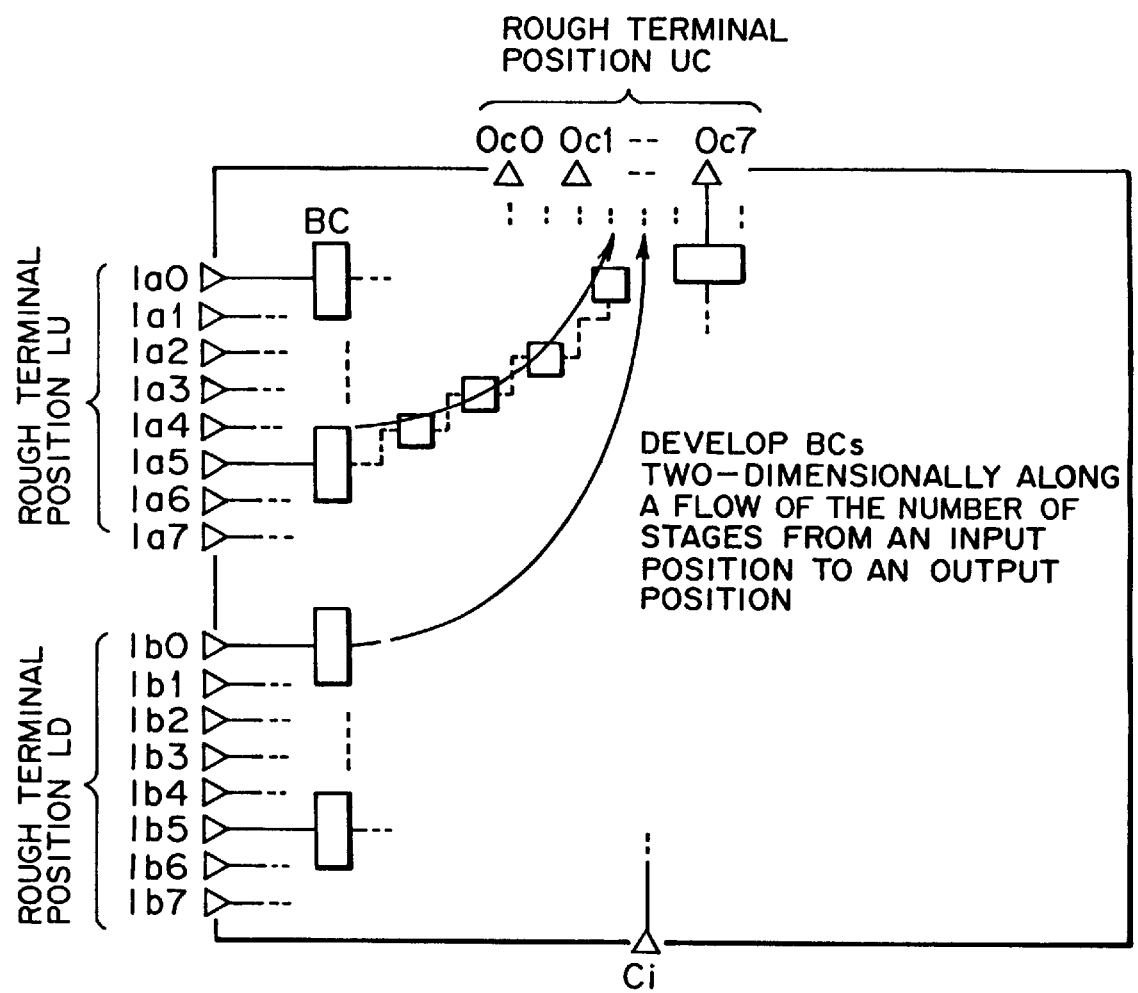
FIG. 10 shows a result of a two-dimensional BC mapping process performed on the example of the logic circuit description shown in FIG. 9.

A rough placement and a two-dimensional mapping process on the logical circuit with the rough port information specified as shown in FIG. 9 allows generation of a circuit scheme in the BC level as shown in FIG. 10. Detailed description of the circuit scheme shown in FIG. 10 will be made later.

When all logic design information (abstract circuit information) about the LSI that is an object of the design is stored in the file 6, the high-level packaging design unit 32 determines rough placement positions of virtual blocks on the basis of the information stored in the file 6 to perform a rough design (a virtual packaging design) as below.

Figure 12:
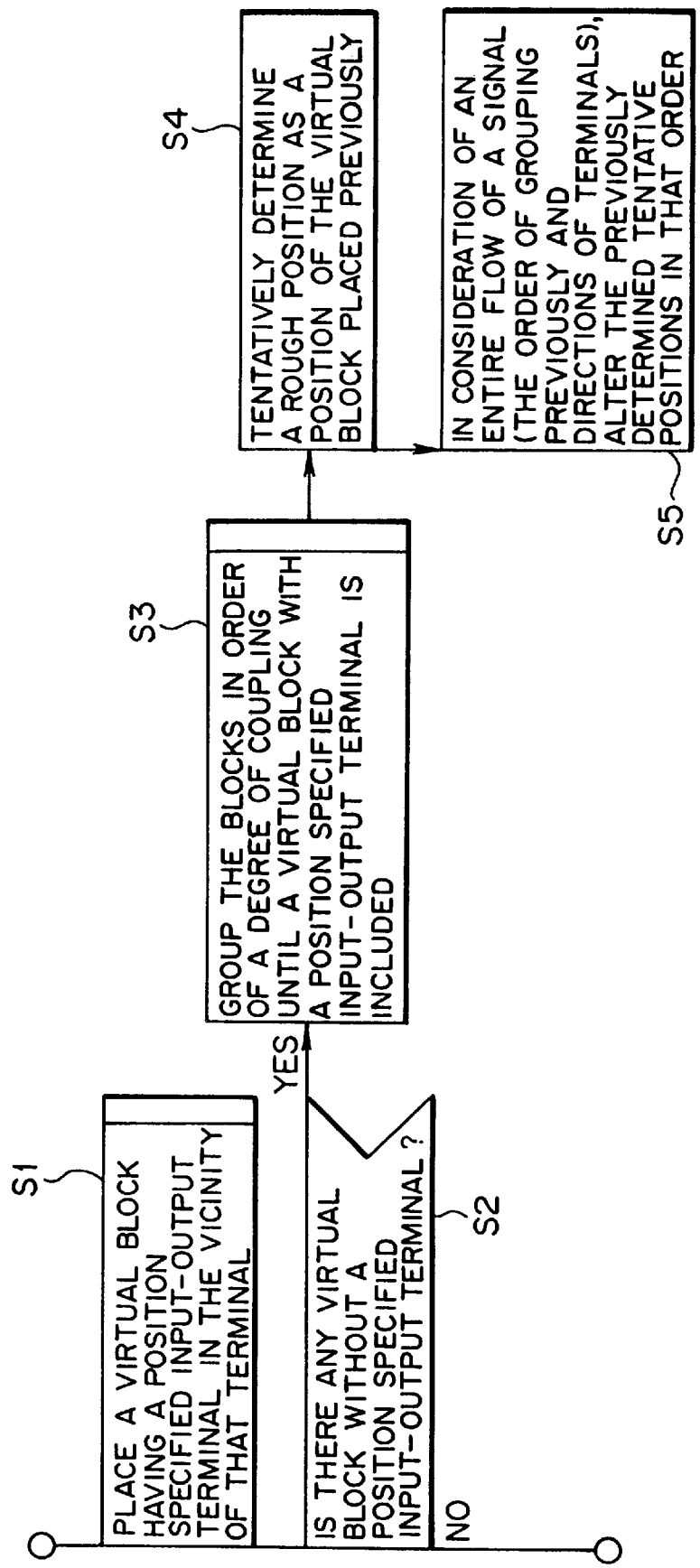
FIG. 12 is a flowchart for illustrating a procedure of a virtual multiplex hierarchical block placement according to the embodiment.

First, the virtual block initial placement unit 34 simplifies the placing process by treating a block that is an object more abstractly than before, and a rough block placement (a virtual multiplex hierarchical block placement) is performed according to a flowchart (from Steps S1 through S5) shown in FIG. 12.

Namely, a virtual block having a position specified input-output terminal is first placed in the vicinity of this terminal (Step S1). The process at Step S1 is repeated until all virtual blocks having the position specified input-output terminal are placed.

A judgement is made as to whether there is any virtual block without a position specified input-output terminal (Step S2). If there is no such virtual block, the initial placement process on the virtual block is terminated. If such virtual block is present, the procedure proceeds to Step S3.

At Step S3, virtual blocks are grouped in order of degree of logical coupling of the virtual block (a condition of a connection between the blocks) until a virtual block having a position specified input-output terminal is included. By repeating this process, a duplex hierarchization is so performed that all blocks include the position specified input-output terminal.

The rough position is tentatively determined as a position of a virtual block having been placed previously (Step S4). The position of the virtual block whose rough position has been tentatively determined is corrected and altered by the floor planner 35 in consideration of an entire flow of a signal (the order and direction of the virtual blocks having been grouped previously) and block routing limitation information (Step S5).

The processes executed at Steps S3 and S4, respectively, are more practically described with reference to FIG. 11. An LSI that is an object of the design shown in FIG. 11 has input terminals named i1 through i8 and output terminals named O1 through O5. Eight virtual blocks BLK 1 through BLK 8 are roughly placed on the LSI.

The block BLK1 has input terminal i1 and i2 as position specified input-output terminals, the block BLK2 has an input terminal i3 and an output terminal O5 as the position specified input-output terminals, the blocks BLK4 and BLK6 have commonly an input terminal i3 as the position specified input-output terminal, the block BLK7 has input terminals i5 through i7 and output terminals O1 through O3 as the position specified terminals, and the block BLK8 has an input terminal i8 as the position specified input-output terminal.

The blocks BLK3 and BLK 5 have no positional specified input-output terminal. However, the block BLK3 has a high degree of coupling to the block BLK1. The block BLK5 has a high-degree of coupling to the block BLK1 next to the block BLK3.

If the virtual blocks BLK1 through BLK8 are roughly placed according to a procedure shown in FIG. 12, the blocks BLK1, BLK2, BLK4, and BLK6 through BLK8 each is first placed in a region in the vicinity of a corresponding position specified input-output terminal or terminals in the process at Step S1. At that time, a virtual block given the rough placement information is placed in a position according to the rough placement information by referring to this rough placement information.

After that, the block BLK3 having a high-degree of coupling to the block BLK1 is made be included within the block BLK1 in the process at Step 3. Further, the block BLK5 having a high-degree of coupling to the block BLK1 is made be included in the block BLK1. In the processes at the following steps S4 and S5, the blocks BLK1, BLK3 and BLK5 are treated as one virtual duplex hierarchical block BLK1 having a position specified input-output terminal.

After the virtual duplex hierarchical block placement by the virtual block initial placement unit 34 as above, positions of the virtual blocks are corrected and altered to suitable positions, respectively, in an interactive mode by the floor planner 35. The previous duplex hierarchical block structure is displayed as a index for judgement on the display to enhance an efficiency of the interactive process.

The process to correct and refine the positional condition by the floor planner 35 is executed on the basis of conditions of the virtual blocks having been roughly placed in consideration of connection conditions between the blocks and rough areas of the blocks. In particular, it is important that the design information about the number of the virtual blocks or the connection relations between the blocks is so abstracted that the design information has a volume that can be sufficiently grasped by the designer, and is processed in a top-down fashion.

A result of the correction by the floor planner 35 (a result of the chip design) is stored as the rough placement information in the file 36. The result of the design obtained by performing a correction process on the example of the rough placement shown in FIG. 11 is, for example, as shown in FIG. 13.

Figure 13:
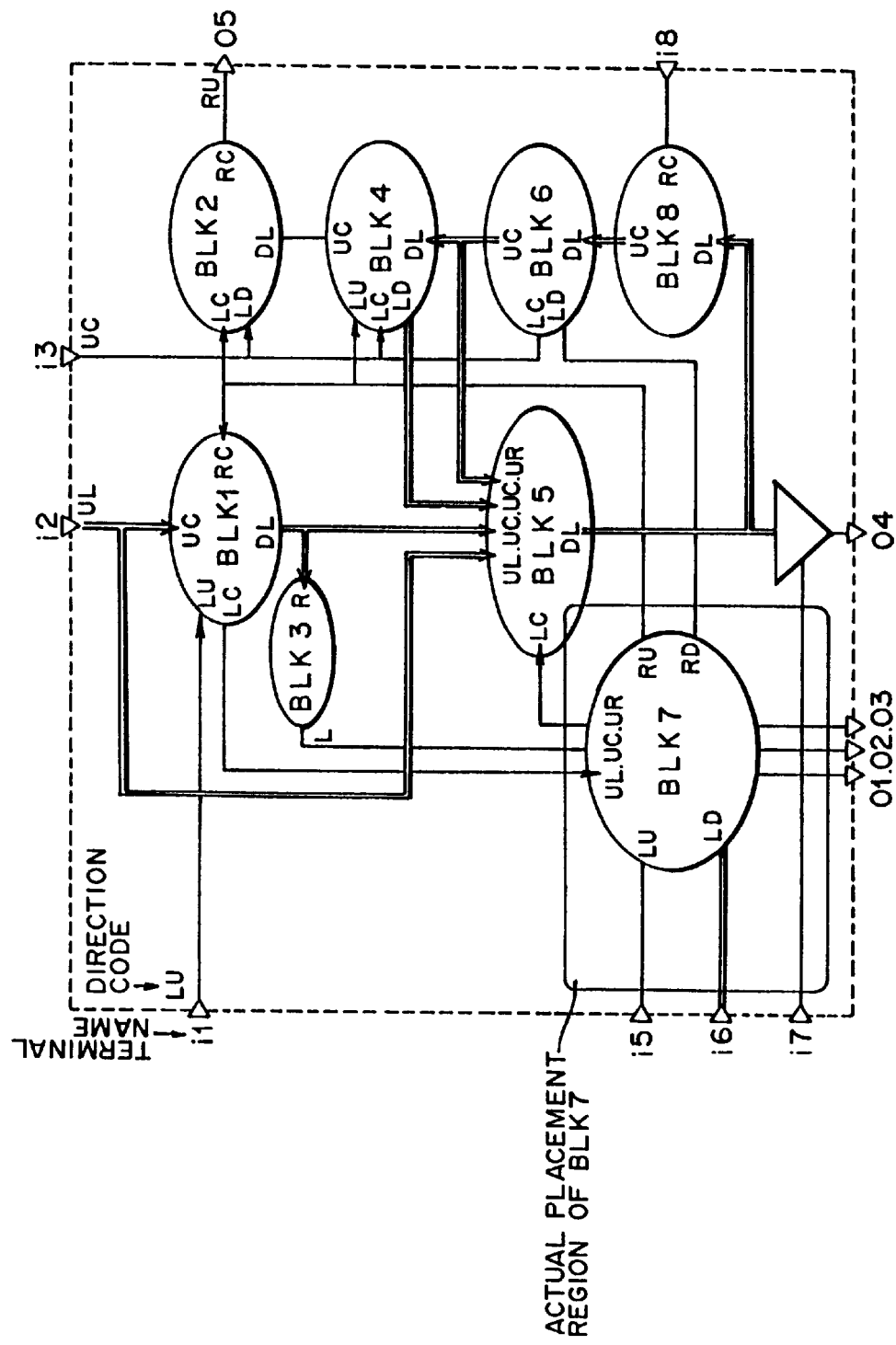
FIG. 13 shows a result of a chip design by the high-level packaging design unit according to the embodiment.

The result of the chip design is printed out as an LSI chip design scheme (a functional scheme) 38 as shown in FIG. 13 by the functional scheme output unit 37. At that time, necessary information such as block function names or signal names are edited and entered in the rough placement scheme corresponding to an estimated BC area. In the case of an LSI, the functional scheme 38 is effective in an event of a total evaluation or analysis as a chip design scheme. If an actual placement region is given to, for example, the block BLK7 as the rough placement information, the actual placement region is entered and represented in the functional scheme 38 as shown in FIG. .13.

The two-dimensional BC mapping process unit 39 maps the logic design information defined by the function symbols stored in the file 6 onto the BCs of an object technology. If information of a rough input-output pin direction is defined, a two-dimensional BC mapping corresponding to an actual BC placement image is performed. More specifically, input-output terminals are allocated first according to the respective defined positions, then the BCs are placed along a flow of a signal from the input side to the output side as shown in FIG. 10 so as to perform the two-dimensional mapping.

After that, superfluous BCs such as gates which are functionally mapped are deleted, then a result of the two-dimensional mapping is stored in the file 40. The file 40 is a complete logical database developed into basic cells (BCs) of the packaging design. The file 40 thus stores information in volume approximately 100 times that of the information in the file 6.

When the logical database is made in the file 40, the BC placement processing unit 42 develops BCs in each block on the basis of the rough placement information stored in the file 36 and the logical database in the file 40, and places the BCs on the coordinates of the actual LSI. If a placement region is specified in advance, the initial placement is performed according to the specification. After the initial placement, a placement refining process is so performed that a placement condition of each of the BCs is optimal, and a minute adjustment of the placement position of each of the BCs is performed.

The BC routing process unit 43 executes routing between the placed BCs on the basis of the connection information under specified conditions. The BCs are automatically routed while keeping limitations such as designated wire lengths, parallel routing limitation, etc. so as to meet the rules of route delay or route noise.

The mask design data generating unit 14 generates design data for a mask necessary to fabricate a circuit such as a semiconductor on the basis of a result of the packaging design obtained as above. The design data is then sent to a factory in which the circuit is actually fabricated.

According to the embodiment of this invention, an association of the high-level logic design (a design by the logic design unit 31) and the high-level packaging design (a design by the high-level packaging design unit 32) is available. Repetition of the floor planning that is heretofore performed in the BC level in the packaging design may be omitted, thus the floor planning may be efficiently performed in a level of virtual blocks (function block cells), that is, a higher abstract level (a high level). It is therefore possible to design a high-function, high-density circuit such as an LSI from the beginning.

Accordingly, it is possible to realize an increase of an yielding rate and a reduction of a cost in the fabrication of the circuit. As this, the method and the apparatus of this invention are extremely advantageous when an electronic circuit whose scale will be increased more and more in the future is designed and fabricated.

In the above embodiment, the description has been made by way of an example where the circuit that is an object of the design is an LSI. It should be noted that this invention is not limited to the above example. This invention is applicable to a design for various electronic circuits such as a printed wiring board, and may give the same advantages and effects as the above embodiment.

What is claimed is:

1. A method for designing a circuit in a predetermined area on a substrate, comprising the steps of:
    reading text information that describes logic design information and packaging position specifying information of a circuit in a hardware description language;
    making a logical synthesis of the text information into a set of function block cells, each of which is at a higher abstract level than a packaging basic cell, to thereby extract the packaging position specifying information and abstract circuit information about said function block cells from the text information;
    grouping the function block cells into cells having position specified input-out terminals and function block cells not having position specified input-output terminals;
    determining a rough placement position of each of said function block cells having position specified input-output terminals on the basis of the packaging position specifying information before determining a rough placement position of each of said function block cells not having position specified input-output terminals; and
    developing each said function block cells into a number of packaging basic cells in the predetermined area of the substrate on the basis of the rough placement position of each said function block cell and the abstract circuit information, to thereby perform packaging designing of said circuit.

2. The method of designing a circuit according to claim 1, wherein
    the text information includes the packaging position specifying information that represents an initial placement position of each said function block cell in the predetermined area of the substrate, and
    the rough placement position of each said function block cell is determined according to the initial placement position of each said function block cell in said determining step.

3. The method for designing a circuit according to claim 1, wherein
    said circuit has one or more ports each of which is to be placed in a predetermined position on said substrate,
    the text information includes the packaging position specifying information that represents the predetermined position of each of the ports that are to be connected to each said function block cell, and
    the rough placement position of each said function block cell is determined on the basis of the position of each said port.

4. The method for designing a circuit according to claim 1, wherein
    the text information includes the packaging position specifying information that represents a position of each terminal of each said function block cell, and
    the rough placement position of each said function block cell is determined on the basis of the position of each said terminal and connection information between said function block cells in said determining step.

5. The method for designing a circuit according to claim 4, further comprising the steps of:
    grouping two or more of said function block cells adjacent to each other into a single group on the basis of the position of each said terminal and the connection information between said function block cells; and
    determining the rough placement position of said group of function block cells.

6. The method for designing a circuit according to claim 1, wherein
    the text information includes the packaging position specifying information that represents a placement region within which each said function block cell is developed into the corresponding packaging basic cells, and
    the rough placement position of each said function block cell is determined according to said placement region in said determining step.

7. The method for designing a circuit according to claim 1, wherein
    the text information includes the packaging position specifying information that represents wire length limitation information between said function block cells, and
    the rough placement position of each said function block cell is determined according to the wire length limitation information in said determining step.

8. The method for designing a circuit according to claim 1, further comprising the step of outputting a result in said step of determining the rough placement position as a functional scheme.

9. The method for designing a circuit according to claim 1, wherein said abstract circuit information is logic circuit information synthesized from a hardware description language.

10. The method for designing a circuit according to clam 1, further comprising the step of inputting the packaging position specifying information as logical information about function symbols.

11. The method for designing a circuit according to claim 1, wherein, in addition to the rough placement position of each said function block cell and the abstract circuit information, the packaging position specifying information is used in said developing.

12. An apparatus for designing a circuit in a predetermined area on a substrate, comprising:
    a logic design unit for performing logic designing of said circuit, said logic design unit comprising
        a hardware description language reading unit for inputting text information that describes logic design information and packaging position specifying information of said circuit in a hardware description language, and
        a logic synthesis unit making a logical synthesis of the text information from said hardware description language reading unit into a set of function block cells, each of which is at a higher abstract level than a packaging basic cell, to thereby extract the packaging position specifying information and abstract circuit information of said function block cells from the text information;

a high-level packaging design unit for determining a rough placement position of each of said function block cells in the predetermined area of the substrate on the basis of the packaging position specifying information from said logic design unit, such that the rough placement positions of the cells having position specified input-output terminals are determined before the rough placement positions of the cells not having position specified input-output terminals; and a packaging design unit for developing each said function block cells into a number of corresponding packaging basic cells in the predetermined area of the substrate on the basis of the rough placement position determined by said high-level packaging design unit and the abstract circuit information from said logic design unit, to thereby perform packaging designing of said circuit.

13. The apparatus for designing a circuit according to claim 12, wherein when the text information that has been read by said logic design unit includes the packaging position specifying information that represents an initial placement position of each said function block cell, said high-level packaging design unit determines the rough placement position of each said function block cell on the basis of the initial placement position.

14. The apparatus for designing a circuit according to claim 12, wherein when said circuit has one or more ports each of which is to be placed in a predetermined position on said substrate and the text information that has been read by said logic design unit includes the packaging position specifying information that represents a position of each of the ports that are to be connected to each said function block cell, said rough design unit determines the rough placement position of each said function block cell on the basis of the position of each said port.

15. The apparatus for designing a circuit according to claim 12, wherein when the text information that has been read by said logic design unit includes the packaging position specifying information that represents a position of each of terminals of each said function block cell, said high-level packaging design unit determines the rough placement position of each said function block cell on the basis of the position of each said terminal and connection information between said function block cells in said determining step.

16. The apparatus for designing a circuit according to claim 13, wherein said high-level packaging design unit is operable for grouping two or more of said function block cells adjacent to each other into a single group on the basis of the position of each said terminal and the connection information between said function block cells and, further, determining the rough placement position of said group of function block cells.

17. The apparatus for designing a circuit according to claim 12, wherein when the text information that has been read by said logic design unit includes the packaging position specifying information that represents a placement region within which each said function block cell developed into the corresponding packaging basic cells, said high-level packaging design unit determines the rough placement position of each said function block cell according to said placement region.

18. The apparatus for designing a circuit according to claim 12, wherein when the text information that has been read by said logic design unit includes the packaging position specifying information that represents wire length limitation information between said function block cells, said high-level packaging design unit determines the rough placement position of each said function block cell according to the wire length limitation information.

19. The apparatus for designing a circuit according to claim 12 further comprising an output unit for outputting a result of determination of the rough placement position from said high-level packaging design unit as a functional scheme.

20. The apparatus for designing a circuit according to claim 12, wherein said logic design unit comprising:

a hardware description language input unit for inputting a hardware description language in a text mode; and a logic synthesis processing unit for synthesizing logic circuit information from the hardware description language inputted from said hardware description language input unit and outputting it as said abstract circuit information to said rough design unit.

21. The apparatus for designing a circuit according to claim 12, wherein said logic design unit further includes a function symbol input unit for inputting the abstract circuit information and the packaging position specifying information as logical information about function symbols.

22. The apparatus for designing a circuit according to claim 12, wherein said packaging design unit uses, in addition to the rough placement position of each said function block cell and the abstract circuit information, the packaging position specifying information during the development of each said function block cell.

23. A method for designing a circuit which includes a multiplicity of basic cells arranged in a predetermined area on a substrate according to the interconnection relationship between the multiple basic cells, said method comprising the steps of:

(a) providing text data described in hardware description language for an object circuit to be designed, said text data including logic design information, which defines a logic design of the object circuit, and packaging position specifying information, which defines prospective rough locations of multiple basic cells of the object circuit in terms of function block cells, each of which prospectively corresponds to a number of basic cells, each of which prospectively corresponds to a number of basic cells among the multiple basic cells of the object circuit;

(b) reading said text data provided in said step (a) to extract the logic design information and the packaging position specifying information of the object circuit;

(c) making a logical synthesis for the object circuit based on said logic design information extracted from said text data in said step (b) to generate abstract circuit information of the object circuit, said abstract circuit information including both high-level function symbols representing a plurality of function block cells and connection information relating to interconnections between said high-level function symbols;

(d) determining a subarea of each of the plural function block cells in the predetermined area of the substrate based on both said packaging position specifying information extracted from said text data in said step (b) and said abstract circuit information generated in said step (c); and (e) developing each of said function block cells into said plural basic cells of a corresponding set, in such a manner that the individual basic cells are arranged within the corresponding subarea determined in said step (d) based on said abstract circuit information generated in said step (c).

24. An apparatus for designing a circuit which includes a multiplicity of basic cells arranged in a predetermined area on a substrate according to the interconnection relationship between the multiple basic cells, said apparatus comprising:

(a) a logic design unit for performing logic designing of said circuit, said logic design unit including (i) a hardware description language reading unit for reading text data described in hardware description language for an object circuit to be designed, said text data including logic design information, which defines a logic design of the object circuit, and packaging position specifying information, which defines prospective rough locations of multiple basic cells of the object circuit in terms of function block cells, each of which prospectively corresponds to a number of basic cells among the multiple basic cells of the object circuit, to extract the logic design information and the packaging position specifying information of the object circuit, and (ii) a logic synthesis unit for making a logical synthesis for the object circuit based on said logic design information extracted from said text data in said hardware description language reading unit to generate abstract circuit information of the object circuit, said abstract circuit information including both high-level function symbols representing a plurality of function block cells and connection information relating to interconnections between said high-level function symbols;

(b) a high-level packaging design unit for performing a high level packaging design by determining a subarea of each of the plural function block cells in the predetermined area of the substrate based on both said packaging position specifying information extracted from said text data in said hardware description language reading unit and said abstract circuit information generated in said logic synthesis unit; and (c) a packaging design unit for performing a packaging design by developing each of said function block cells into said plural basic cells of a corresponding set, in such a manner that the individual basic cells are arranged within the corresponding subarea determined in said high-level packaging design unit based on said abstract circuit information extracted in said hardware description language reading unit.

* * * * *

UNITED STATES PATENT AND TRADEMARK OFFICE
CERTIFICATE OF CORRECTION

PATENT NO. : 6,086,625
DATED : July 11, 2000
INVENTOR(S) : Akihisa Shouen

It is certified that error appears in the above-identified patent and that said Letters Patent is hereby corrected as shown below:

Title page
[56] References Cited

All U.S. Patents have wrong class and subclass:

| | |
|---|---|
| 5,224,056 | change "395/500.08" to -- 364/490 --. |
| 5,239,465 | change "395/500.09" to -- 364/419.19 --. |
| 5,416,721 | change "395/500.12" to -- 364/491 --. |
| 5,426,591 | change "395/500.07" to -- 364/489 --. |
| 5,513,124 | change "395/500.08" to -- 364/491 --. |
| 5,530,654 | change "395/500.19" to -- 364/488 --. |

Column 17,
Line 2, change "claim 13" to -- claim 15 --.

Signed and Sealed this

Twenty-fifth Day of September, 2001

Attest:

NICHOLAS P. GODICI
Attesting Officer   Acting Director of the United States Patent and Trademark Office